United States Patent
Landheer et al.

(10) Patent No.: US 6,700,171 B2
(45) Date of Patent: Mar. 2, 2004

(54) GATE DIELECTRIC

(75) Inventors: Dolf Landheer, Ottawa (CA); James Gupta, Ottawa (CA)

(73) Assignee: National Research Council of Canada, Ottawa (CA)

( * ) Notice: Subject to any disclaimer, the term of this patent is extended or adjusted under 35 U.S.C. 154(b) by 0 days.

(21) Appl. No.: 09/984,266

(22) Filed: Oct. 29, 2001

(65) Prior Publication Data

US 2002/0050608 A1 May 2, 2002

Related U.S. Application Data

(60) Provisional application No. 60/243,764, filed on Oct. 30, 2000.

(51) Int. Cl.[7] .................. H01L 29/76; H01L 29/94; H01L 31/062; H01L 31/113; H01L 31/119
(52) U.S. Cl. ................. 257/411; 257/410; 257/310
(58) Field of Search ..................... 257/310, 410, 257/411, 412, 324

(56) References Cited

U.S. PATENT DOCUMENTS

| | | | |
|---|---|---|---|
| 6,093,944 A | 7/2000 | VanDover | 257/310 |
| 6,277,681 B1 | 8/2001 | Wallace et al. | 438/198 |
| 6,291,283 B1 * | 9/2001 | Wilk | 438/216 |
| 6,291,867 B1 | 9/2001 | Wallace et al. | 257/410 |
| 6,300,203 B1 * | 10/2001 | Buynoski et al. | 438/287 |
| 6,413,386 B1 * | 7/2002 | Callegari et al. | 204/192.23 |
| 2002/0005556 A1 * | 1/2002 | Cartier et al. | 257/381 |

\* cited by examiner

*Primary Examiner*—Shouxiang Hu
(74) *Attorney, Agent, or Firm*—Marks & Clerk

(57) ABSTRACT

The use of doped or undoped rare-earth silicates, according to the formula $MSi_xO_y$ wherein M is a rare-earth element, in semiconductor technology is disclosed. In particular, gadolinium silicate as a gate dielectric of a metal-insulating-semiconductor device is disclosed. The insulator of the metal-insulating-semiconductor device is fabricated by exposing a suitably cleaned and terminated surface of a semiconductor substrate to a simultaneous or sequential flux of rare-earth atoms, silicon atoms and oxygen atoms, and annealing the resulting rare-earth containing layer. The use of higher dielectric constant material, such as provided by the invention, reduces the tunneling current through the device, since layers of greater thickness can be used.

32 Claims, 5 Drawing Sheets

GATE DIELECTRIC

CROSS-REFERENCE TO RELATED APPLICATION

This application claims the benefit of U.S. Provisional Application No. 60/243,764 filed Oct. 30, 2000, incorporated by reference herein.

FIELD OF THE INVENTION

The present invention relates to the technology of semiconductors. More specifically, the present invention relates to gate dielectrics for metal-insulator-semiconductor capacitors and transistors, and methods for forming such.

BACKGROUND OF THE INVENTION

Field effect transistors (FETs) are common in the electronics industry. FIG. 1 discloses a typical FET 10 in cross-section. In a FET, a portion of the substrate 12 near the surface is designated as the channel 14 during processing. Channel 14 is electrically connected to source 16 and drain 18, such that when a voltage difference exists between source 16 and drain 18, current will tend to flow through channel 14. The semiconducting characteristics of channel 14 are altered such that its resistivity may be controlled by the voltage applied to conductive gate 20, a conductive layer overlying channel 14. Thus by changing the voltage on conductive gate 20, more or less current can be made to flow through channel 14. Conductive gate 20 and channel 14 are separated by gate dielectric 22. The gate dielectric is insulating, such that between gate 20 and channel 14 little or no current flows during operation (although "tunneling" current is observed with thin dielectrics as is described below). However, the gate dielectric allows the gate voltage to induce an electric field in channel 14, giving rise to the name "field effect transistor." Typically, the gate dielectric material is silicon dioxide ($SiO_2$.)

Generally, integrated circuit performance and density may be enhanced by "scaling", that is by decreasing the size of the individual semiconductor transistors on a chip. Unfortunately, field effect semiconductor transistors produce an output signal that is proportional to the length of the channel, such that scaling reduces their output. This effect has generally been compensated for by decreasing the thickness of gate dielectric 22, thus bringing the gate in closer proximity to the channel and enhancing the field effect.

By 2005, it is anticipated that $SiO_2$ gate oxides of 1.0 to 1.5 nm thickness will be required for the so-called 100 nm technology node. At these thicknesses, the direct tunneling current through $SiO_2$ layers begins to become prohibitive.

Although further scaling of FETs is still possible, scaling of the gate dielectric thickness has almost reached its practical limit with the conventional gate dielectric material, silicon dioxide. Further scaling of silicon dioxide gate dielectric thickness will involve a host of problems: extremely thin layers allow for large leakage currents due to direct tunneling through the oxide. Because such layers are formed literally from a few layers of atoms, exacting process control is required to repeatably produce such layers. Uniformity of coverage is also critical because device parameters may change dramatically based on the presence or absence of even a single monolayer of dielectric material. Finally, such thin layers form poor diffusion barriers to impurities.

Realizing the limitations of silicon dioxide, researchers have searched for alternative dielectric materials which can be formed in a thicker layer than silicon dioxide and yet still produce the same field effect performance. One alternative for achieving low equivalent oxide thicknesses is metal oxides, such as tantalum pentoxide, titanium dioxide, and barium strontium titanate. However, researchers have found formation of such metal oxides as gate dielectrics to be problematic since they can be directly reduced by the silicon substrate resulting in the formation of a layer of $SiO_2$ between the films and the Si substrate. Metal oxides such as $ZrO_2$, $HfO_2$, many of the rare-earth oxides, and the analogous metal silicates of the forgoing metal oxides, do not undergo such reactions directly; however, at typical deposition temperatures, the oxygen ambient or oxygen-containing precursor required to form them tends to also oxidize the silicon substrate, producing an oxide layer at the interface between the substrate and the gate dielectric. These interfacial layers can also be formed if the dielectric layers are annealed in an environment containing oxygen or oxygen-bearing molecules. The presence of this interfacial oxide layer increases the effective oxide thickness, reducing the effectiveness of the alternative gate dielectric approach.

The use of alternative dielectric materials, such as silicon nitride, has also been considered as a means to increase the gate dielectric constant and also to serve as a diffusion barrier to dopants in the gate material. However, the current silicon nitride fabrication techniques on Si (100) result in an amorphous nitride or oxynitride layer which may exhibit deleterious interface states (traps) which degrade ultimate device performance.

A separate problem with silicon dioxide dielectrics is that the extremely small thicknesses allow unacceptable leakage currents as a result of electrons tunneling from the gate to the drain regions of transistors. Since silicon nitride has a larger bulk dielectric constant than silicon dioxide (about 7 compared to about 3.9), a thicker silicon nitride layer can be used which has the same capacitance density as a thinner silicon dioxide layer. Since electron tunneling currents depend exponentially on layer thickness, even an increase in dielectric thickness of about 10 to about 20 Angstroms could reduce leakage current by many orders of magnitude.

Candidate materials for gate dielectrics have been arranged by the International Technology Roadmap for Semiconductors (ITRS) into four categories:

1. Medium κ (10–20) (amorphous) Unary oxides: including $Ta_2O_5$, $TiO_2$, $ZrO_2$, $HfO_2$, $Y_2O_3$, $La_2O_3$, $Gd_2O_3$, $Sc_2O_3$, etc.
2. Medium κ (10–20) (amorphous) Silicates: including (Zr, Hf, La, Ti . . . )—$SiO_4$, etc.
3. High κ (>20) (amorphous) oxides: including $LaAlO_3$, $ZrTiO4$, (Zr, Sn)$TiO_4$ $SrZrO_4$, etc.
4. High κ (>20) (single crystal) oxides: $LaAl_3O_4$, $BaZrO_3$, $Y_2O_3$, $La_2O_3$, etc.

Films of these types have been deposited on silicon using a number of techniques including electron-beam evaporation, chemical vapor deposition and its variants, molecular beam epitaxy and sputtering (for example, see U.S. Pat. No. 6,093,944 issued Jul. 25, 2000, which is incorporated herein by reference). However, many of these candidate materials have been observed to react with the semiconductor substrate to form unintentional intermediate layers having lower dielectric constant than the pure oxide, i.e. the desired high-κ oxide/substrate structure actually becomes high-κ oxide/mixed (high-κ, $SiO_x$)/substrate. Also, many of these materials form polycrystalline films on silicon. This leads to high leakage current and unwanted defects, and also makes the films susceptible to further crystallization and instability during thermal device processing.

It has been demonstrated that both Zr and Hf silicate ($ZrSi_xO_y$, $HfSi_xO_y$) gate dielectric layers, of category 2, can be produced having amorphous structure, low leakage current, reasonably high dielectric constant and good thermal stability in contact with silicon. These transition-metal-silicates have stoichiometries most-closely resembling pseudobinary alloys; i.e., mixtures of $SiO_2$ and the metal oxide. A disadvantage of this approach is that the silicate has a lower dielectric constant than the pure metal-oxide. The films have metal contents of about 2–8 atomic %. Although the metal content in these films may potentially be increased, it has been noted that increasing the metal content significantly decreases the temperature at which the films crystallize or phase separate resulting in unfavorable conformations.

Use of other materials has been disclosed in U.S. Pat. No. 6,291,867 B1 issued Sep. 18, 2001 and U.S. Pat. No. 6,277,681 B1 issued Aug. 21, 2001, both of which are incorporated herein by reference.

Therefore, what is needed is a high dielectric constant material to be used as the gate dielectric in metal-insulator-semiconductor capacitors, transistors, and integrated circuit manufacturing.

SUMMARY OF THE INVENTION

The use of doped or undoped rare-earth silicates, and in particular, gadolinium silicate, as a gate dielectric of a metal-insulator-semiconductor capacitor is disclosed. Also disclosed are the metal-insulator-semiconductor transistors and other devices incorporating the capacitor using the gate dielectric, as well as integrated circuits employing the aforementioned semiconductor devices.

Thus, according to one aspect, the invention provides a capacitive structure comprising a semiconducting substrate; a conductive layer; and a dielectric layer between the substrate and the conductive layer, wherein the dielectric layer is according to the formula $MSi_xO_y$, wherein M is a rare-earth element, and the dielectric layer is doped or undoped.

In another aspect, the invention provides a semiconductor device comprising a capacitive structure having a semiconducting substrate; a conductive layer; and a gate dielectric between the substrate and the conductive layer, wherein the gate dielectric is according to the formula $MSi_xO_y$, wherein M is a rare-earth element, and the dielectric layer is doped or undoped.

Also disclosed is an integrated circuit employing the device.

In another aspect, the invention provides a method of producing a capacitive structure. The method comprises the steps of providing a semiconducting substrate having a surface; and forming over said surface, a dielectric layer according to the formula $MSi_xO_y$, wherein M is a doped or undoped rare-earth element.

There are many advantages in using doped or undoped rare-earth silicates, and in particular, gadolinium silicate, as the gate dielectric of a metal-insulator-semiconductor device. The use of higher-dielectric constant material, such as provided by the invention, reduces the tunneling current through the device, since layers of greater thickness can be used. This results from the fact that the increased electrical permittivity will allow a physically thicker dielectric layer to give the same capacitance as much thinner $SiO_2$ layers.

Other aspects and advantages of embodiments of the invention will be readily apparent to those ordinarily skilled in the art upon a review of the following description.

BRIEF DESCRIPTION OF THE DRAWINGS

Embodiments of the invention will now be described in conjunction with the accompanying drawings, wherein.

This invention will now be described in detail with respect to certain specific representative embodiments thereof, the materials, apparatus and process steps being understood as examples that are intended to be illustrative only. In particular, the invention is not intended to be limited to the methods, materials, conditions, process parameters, apparatus and the like specifically recited herein.

DETAILED DESCRIPTION OF THE PREFERRED EMBODIMENTS

The present invention includes a metal-insulator-semiconductor (including metal-oxide-semiconductor (MOS)) capacitor, transistor and integrated circuit utilizing a metal silicate gate dielectric layer or film as the insulator, and a method for making the same. The materials for use in accordance with one aspect of the invention are rare-earth silicates, according to the formula $MSi_xO_y$, wherein M is a rare-earth element. The term rare-earth element as used herein is intended to be a synonym for lanthanide, which excludes lanthanum and yttrium. The term rare-earth silicate as used herein is intended to encompass rare-earth elements with atomic numbers 58 to 71 (including Pr, Nd, Sm, Eu, Gd, Dy, Ho, Er, Tm, Yb, and Lu. Ce and Tb are excluded since these have more than one metal oxide which makes thermodynamic stability unlikely. Pm is excluded because it has no stable isotope), with silicon (Si) and oxygen (O). Hydrogen may also be incorporated in the films, either intentionally or unintentionally. In the formula $MSi_xO_y$, x is in the range of 0.01 to 40.0, and y is in the range of 0.01 to 80. If the metal atoms are fully bonded to oxygen, then $y=1.5+2x$.

The rare-earth silicates of the present invention may be doped or undoped. Examples of dopants include, but are not limited to, Al, Sr, Vn, Ti, Sc, Ta, and Nb. Preferably, the silicate is amorphous (i.e. not crystallized), since amorphous films generally have higher breakdown performance, form a better diffusion barrier and usually have lower leakage currents.

Specifically mentioned, as an example of a rare-earth silicate is gadolinium silicate ($GdSi_xO_y$). Higher metal contents may be incorporated in these films compared with transition metal silicates, allowing higher dielectric constants to be achieved, and therefore thinner thicknesses of the layer to be achieved. Relative to $HfSi_xO_y$ or $ZrSi_xO_y$, the material according to the invention has a higher metal:silicon ratio while retaining its amorphous character and resistance to crystallization at temperatures as high as 1000–1100° C.

Figure 1:
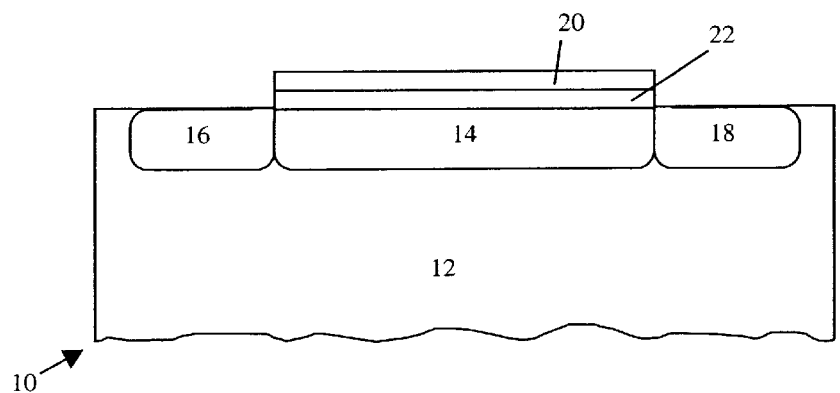
FIG. 1 illustrates a cross-sectional view of a typical metal-insulating-semiconducting field effect transistor.
Figure 2:
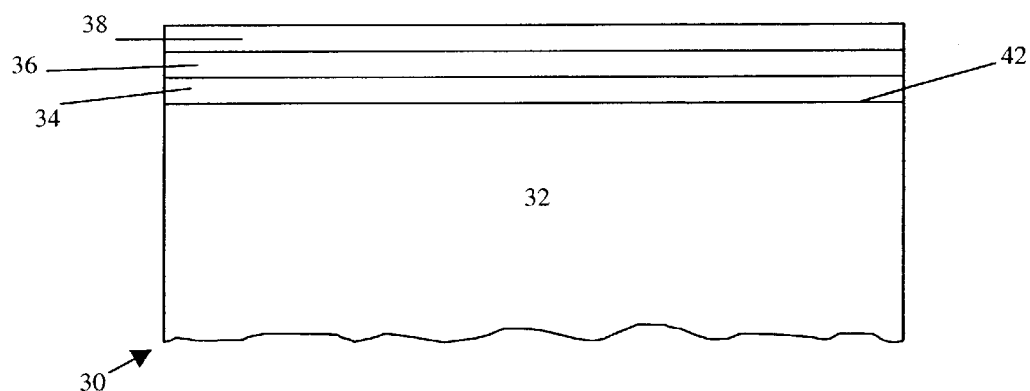
FIG. 2 illustrates a cross-sectional view of a metal-insulating-semiconductor capacitor in accordance with one aspect of the invention.

Referring to FIG. 2, there is illustrated the structure of a metal-insulating-semiconductor capacitor in accordance with one aspect of the invention. Metal-insulating-semiconductor capacitors are used in the fabrication of transistors and other semiconductor devices. The metal-insulating-semiconductor capacitor 30 includes a substrate 32. The substrate preferably is silicon (Si(100) or Si(111)), but also may include other substrate materials such as silicon germanium. Over the substrate is formed an insulating layer or gate dielectric 34 comprising of the inventive material. The metal layer may include an electrode layer 36 of boron- or phosphorous- or arsenic-doped polycrystalline silicon is formed over the dielectric layer to form the completed semiconductor active transistor structure. Optionally, a conductive gate 38 may be deposited over the polycrystalline silicon gate layer to increase its effective conductivity. Conductive layers or conductive multi-layer structures are being developed to replace the conductive polycrystalline silicon layer.

The semiconductor capacitor of FIG. 2 is fabricated by providing a substrate 32 having an exposed surface 42 that is cleaned. The method of cleaning is not believed to be critical to the practice of the invention, as long as a clean, oxide-free substrate surface can be maintained until an overlying deposition is performed. One preferred method of cleaning is by using a Radio Corporation of America (RCA) cleaning process as known in the art. This leaves a thin, non-contaminated oxide layer which is usually removed in a subsequent step.

Figure 3:
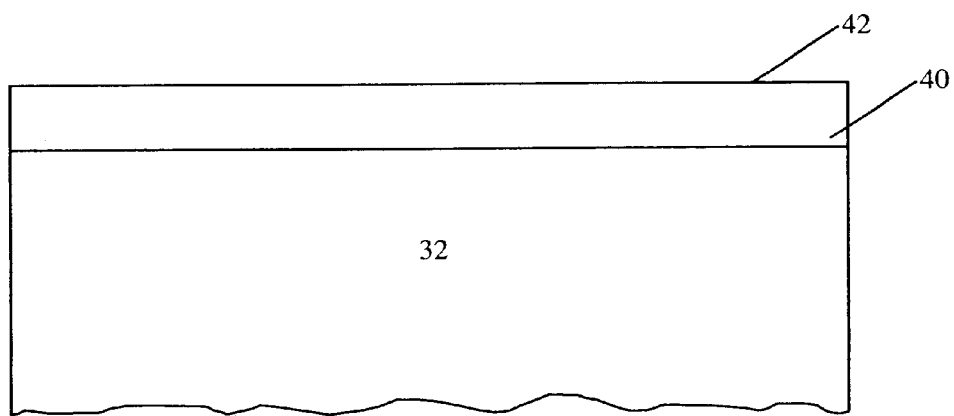
FIGS. 3, 4, 5 and 6 illustrate the metal-insulating-semiconductor capacitor of FIG. 2 at different stages of fabrication.

Referring to FIG. 3, the semiconductor capacitor may also include a buffer layer 40 comprising a thin layer of silicon dioxide or silicon oxynitride deposited under the gate dielectric. The buffer layer serves to improve the electrical properties of the dielectric/substrate interface and to reduce interaction between the gate dielectric and the substrate during subsequent processing. This layer should be thin enough not to contribute substantially to the total effective dielectric thickness of the dielectric layer. Preferably, the buffer layer 40 is not thicker than 5 Angstroms.

Figure 4:
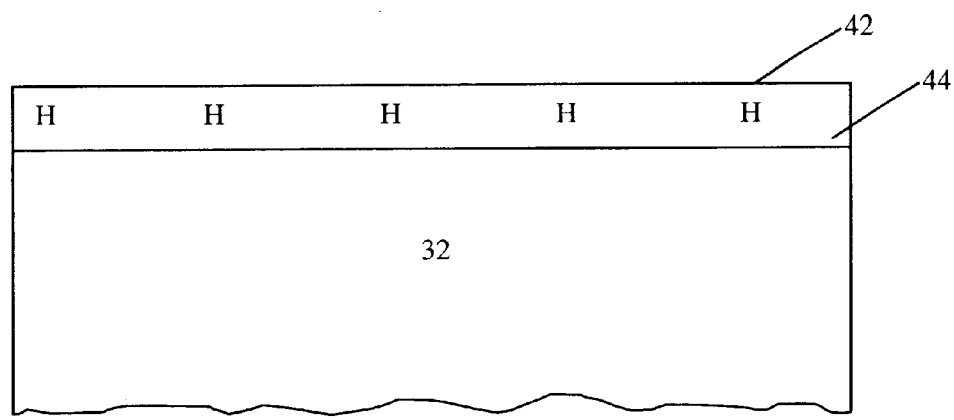

Referring to FIG. 4, if a buffer layer is not present, the cleaning step may be followed by a dip in dilute hydrofluoric acid. This process leaves the substrate surface 42 with a termination layer 44 terminated with hydrogen atoms.

Figure 5:
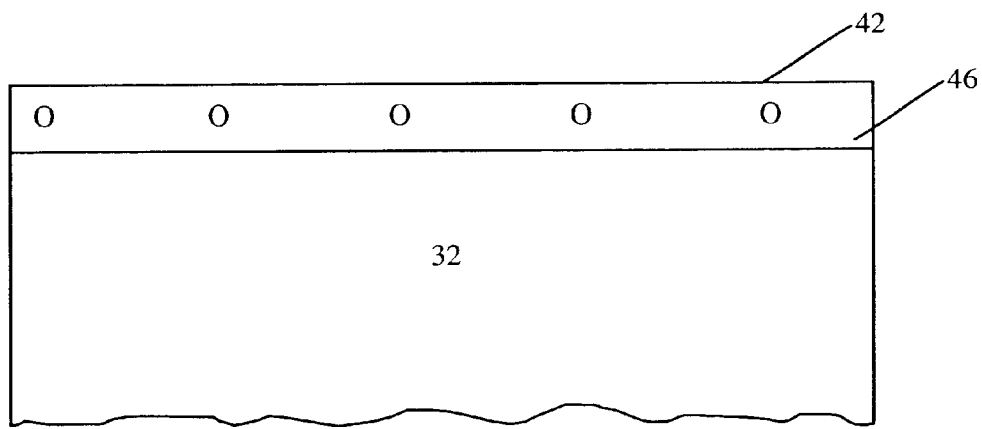

Gd:Si ratios of 2:1 and greater may be achieved without making the films susceptible to crystallization at temperatures below 1000–1100° C. High quality interfaces may be achieved, for instance, by beginning with a hydrogen-terminated Si wafer, the surface of which is further prepared in an ultra-high vacuum (UHV) chamber. Referring to FIG. 5, one way of further preparing the substrate surface 42 is to heat the hydrogen-terminated substrate wafer in $O_2$ at temperatures of 450–600° C. for periods of 1–30 min. This leaves the substrate surface 42 terminated with a 0.5 to 1.0 monolayer termination layer 46 of oxygen atoms.

Figure 6:
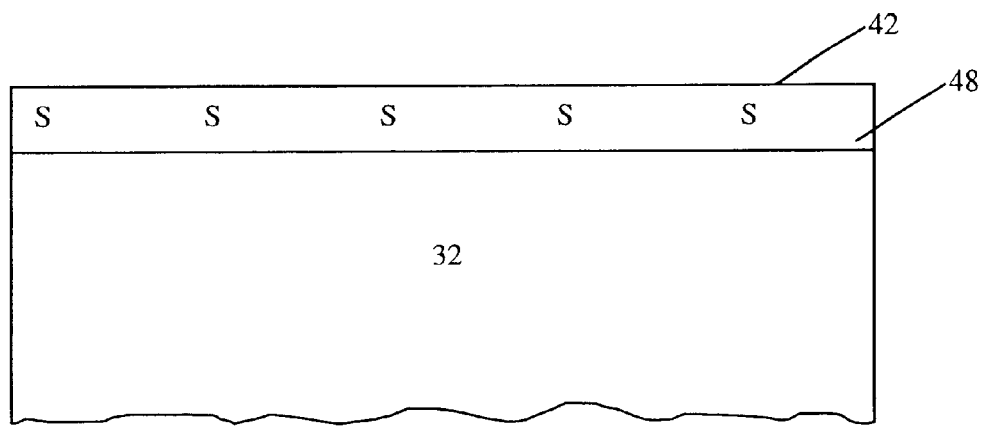

Referring to FIG. 6, alternatively, the hydrogen can be desorbed from the silicon surface by heating in ultra-high vacuum at temperatures above 450° C. for periods of 1–30 min, thus leaving a bare silicon surface 48.

Once the substrate has been prepared to provide either a bare Si surface 48 (as seen in FIG. 6), a termination layer of hydrogen 44 (as seen in FIG. 4), a termination layer of oxygen 46 (as seen in FIG. 5) or a buffer layer 40 (as seen in FIG. 3), as described above, a gate dielectric 34 of the inventive material is formed on the substrate surface 42 by one of several methods. Several of these methods are described below.

Figure 7:
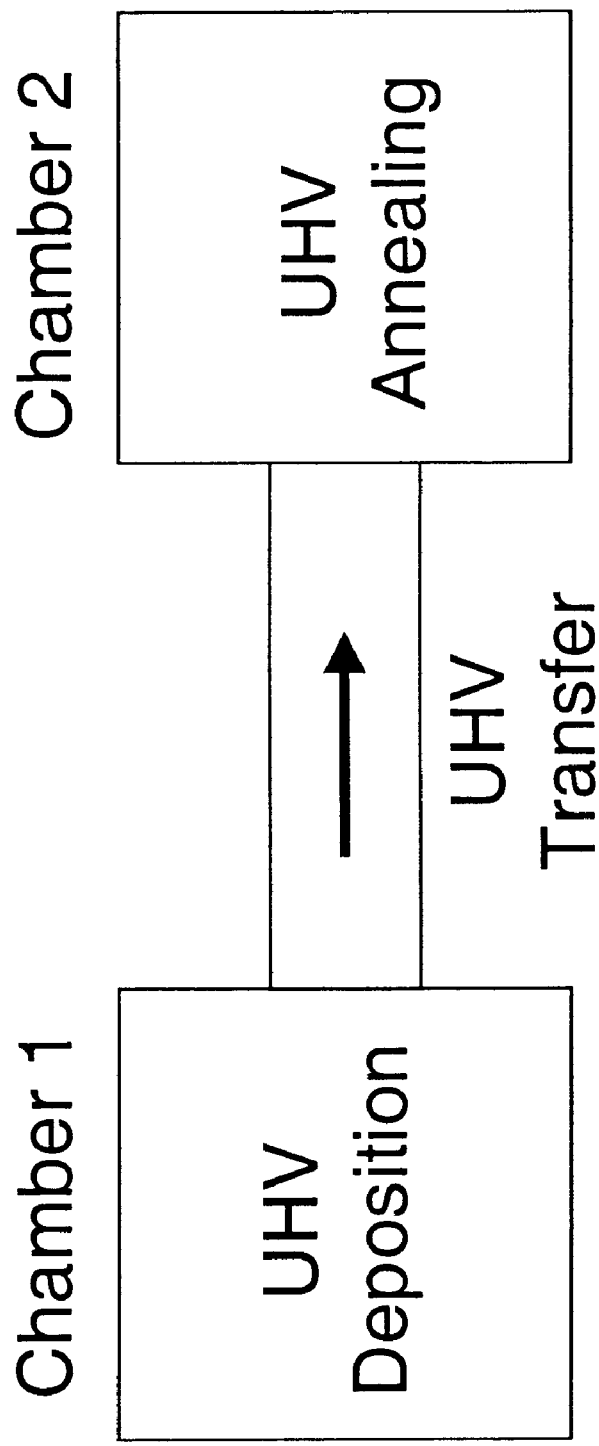
FIG. 7 illustrates an apparatus that can be used in the fabrication of the metal-insulating-semiconductor capacitor of FIG. 2.

Referring to FIG. 7, in a preferred method, the gate dielectric 34 may be deposited by evaporation from an electron-beam source of a pressed-powder solid block or rod consisting of a $(Gd_2O_3)_{1-x}(SiO_2)_x$, a hot-pressed mixture of silica powder and rare-earth oxide powder mixture, in a first chamber (Chamber 1). The net deposition rate is preferably less than 1 nm/s. The substrate is preferably rotated to improve uniformity.

Densification of the dielectric may next be achieved by transferring the wafer after deposition to a second chamber (Chamber 2) and annealing at elevated temperatures. The transfer should be accomplished so that water vapor, or any other source of reactive oxygen during subsequent annealing, does not accumulate on the dielectric surface. This can be accomplished by transferring the wafer under UHV to the annealing chamber. Alternatively, the wafer can be transferred in an inert gas such as $N_2$, or a noble gas (He, Ne, Ar, Kr, Xe). If the dielectric surface is exposed to oxygen-containing molecules during transfer, these should be carefully desorbed in the annealing chamber by heating at a low temperature (400–550° C.) for a sufficient period (1–30 mm) prior to high-temperature annealing, in the exemplary embodiment of the invention, the wafer was transferred under ultra-high vacuum directly from the deposition chamber to the annealing chamber where the annealing step was performed at 800° C. for 5 mm at a pressure of less than $10^{-8}$ Torr. Similar results would likely be obtained at temperatures of about 800° C. to 1000° C., and a pressure of less than $10^{-7}$ Torr. Alternatively, the wafer can be annealed in any inert gas such as $N_2$, or a noble gas (He, Ne, Ar, Kr, Xe) that does not result in significant oxygen diffusion through the dielectric.

In another embodiment, gadolinium silicate films according to the invention may be deposited in production environments by chemical vapor deposition (CVD), in which the semiconductor surface would be exposed to a flux of metalorganic or other molecules providing Gd, Si and O atoms. These molecules can be brought to the surface simultaneously or sequentially.

Finally, if a conductive gate is used, the gate is deposited on the gate dielectric. Processes for depositing conductive gates are well known in the art. For example, the conductive gate may be formed of doped polysilicon, metal, a conductive metal oxide, nitride or a conductive alloy. Multi-layer conductive structures can also be used as gates.

Articles according to the invention typically exhibit dielectric constants higher than 10. As a specific example, Gd-silicate (55% $SiO_2$ and 45% $Gd_2O_3$) dielectric films with physical thicknesses of 4.1 nm according to the invention have capacitance values equivalent to 1.3 nm of pure $SiO_2$. However, the leakage currents through the dielectric films are near $5 \times 10^{-3}$ $Acm^{-2}$ at a gate potential of 1 V. This is a reduction of several orders of magnitude compared to a pure $SiO_2$ film with equivalent capacitance.

Figure 8:
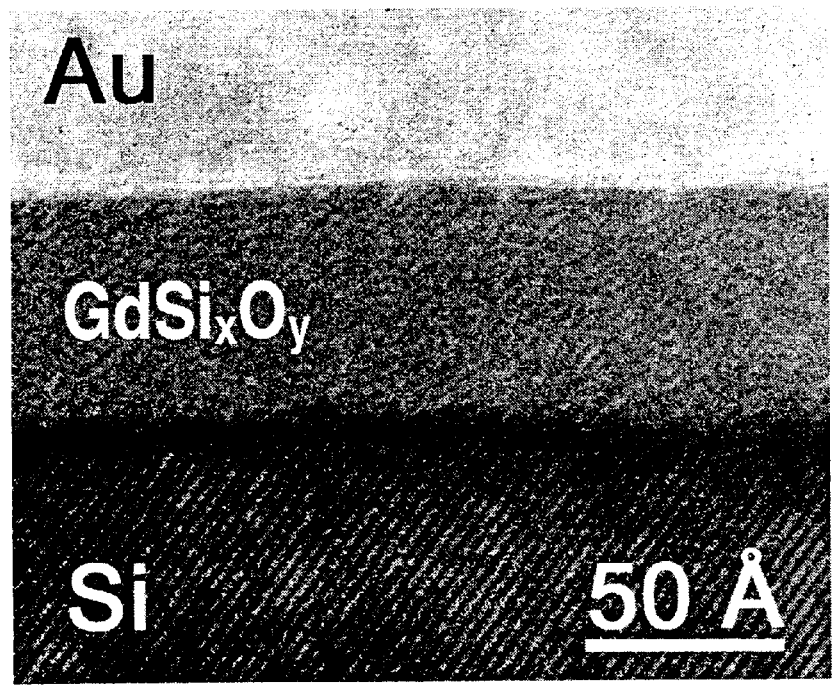
FIG. 8 is a high-resolution transmission electron micrograph of a $Au/GdSi_xO_y/Si$ metal-oxide-semiconductor capacitor.

With the present invention, a gate dielectric may be formed with a dielectric constant substantially higher than that of either conventional thermal silicon dioxide or silicon nitride dielectrics. Thus, the dielectric layer may be made substantially thicker than a conventional gate dielectric with equivalent field effect. The films are amorphous in structure and are highly resistant to interaction with the Si semiconductor as seen in FIG. 8. This has distinct advantages over other materials (e.g. $Gd_2O_3$, $HfSi_xO_y$, and $ZrSi_xO_y$) which may crystallize at lower temperatures during processing, thus forming polycrystalline dielectrics. It also has advantages over other materials such as $TiO_2$, $Ta_2O_5$ and barium strontium titanate that may react with the semiconductor to form unwanted intermediate layers with lower dielectric constants.

Semiconductor/silicate structures according to the invention can be used advantageously in a variety of electronic or optoelectronic devices, e.g., Si-based MOS-FETs, compound semiconductor MOS-FETs, SiGe HEMTs, or SiGe HIGFETs. The term MOSFET device as used herein is intended to include NMOS, PMOS and CMOS technology, including devices identified in the field as DMOS (wherein "D" stands for "diffusion" or "double diffusion"), transistors such as IGBT (Insulated Gate Bipolar Transistor), BiCMOS (CMOS having bipolar devices), DGDMOS (Dual Gate DMOS), and thyristors. The invention is not necessarily limited to Gd, but could be extended to other rare-earth materials as well.

Numerous modifications may be made without departing from the spirit and scope of the invention as defined in the appended claims.

What is claimed is:

1. A capacitive structure comprising a semiconducting substrate; a conductive layer; and a dielectric layer between the substrate and the conductive layer, wherein the dielectric layer is according to the formula $GdSi_xO_y$, wherein the dielectric layer is doped or undoped, and wherein the dielectric layer remains amorphous when heated to a temperature of at least 1000° C.

2. The capacitive structure of claim 1, wherein x is in the range of 0.01 to 40, and y is in the range of 0.01 to 80.

3. The capacitive structure of claim 1, further comprising a buffer layer between the substrate and the dielectric layer.

4. The capacitive structure of claim 3, wherein the buffer layer is silicon dioxide.

5. The capacitive structure of claim 3, wherein the buffer layer is silicon oxynitride.

6. The capacitive structure of claim 1, wherein the substrate has a substrate surface comprising a termination layer of oxygen atoms bound to the silicon atoms in the substrate.

7. The structure of claim 1, wherein the substrate includes a termination layer of atoms, and the dielectric layer is deposited on the termination layer.

8. The structure of claim 7, wherein the substrate is a silicon wafer.

9. The structure of claim 1, wherein the dielectric layer lies on the substrate without an interleaving silicon dioxide layer.

10. The structure of claim 9, wherein the substrate is a silicon wafer.

11. The structure of claim 1, wherein the dielectric layer is physically thick and provides high electrical permittivity.

12. A semiconductor device comprising a capacitive structure having a semiconducting substrate; a conductive layer; and a gate dielectric between the substrate and the conductive layer, wherein the gate dielectric is according to the formula $GdSi_xO_y$; wherein the dielectric layer is doped or undoped, and wherein the dielectric layer remains amorphous when heated to a temperature of at least 1000° C.

13. The device of claim 12, wherein the device is a transistor.

14. The device of claim 13, wherein the transistor is a field effect transistor.

15. The device of claim 12, wherein x is in the range of 0.01 to 40, and y is in the range of 0.01 to 80.

16. The device of claim 12, further comprising a buffer layer between the substrate and the gate dielectric.

17. The device of claim 16, wherein the buffer layer is silicon dioxide.

18. The device of claim 16, wherein the buffer layer is silicon oxynitride.

19. The device of claim 12, wherein the substrate has a substrate surface comprising a termination layer of oxygen atoms.

20. An integrated circuit having a semiconductor device fabricated thereon, comprising a semiconducting substrate; conductive layer; and a dielectric layer between the substrate and the conductive layer, wherein the dielectric layer is according to the formula $GdSi_xO_y$, wherein the dielectric layer is doped or undoped and wherein the dielectric layer remains amorphous when heated to a temperature of at least 1000° C.

21. A capacitive structure made by depositing a doped or undoped dielectric layer, on a semiconducting substrate; and forming a conductive layer over the dielectric layer, wherein the dielectric layer is according to the formula $GdSi_xO_y$, wherein the dielectric layer remains amorphous when heated to a temperature of at least 1000° C.

22. The structure of claim 21, wherein said dielectric layer is formed by exposing the substrate surface to simultaneous or sequential flux of metalorganic or other molecules containing Gd atoms, silicon atoms and oxygen atoms.

23. The structure of claim 22, wherein the dielectric layer is annealed.

24. The structure of claim 23, wherein said annealing is effected in vacuum.

25. The structure of claim 23, wherein said annealing is effected in an inert gas including $N_2$.

26. The structure of claim 23, wherein said annealing is effected in a noble gas including Ar, Ne, Kr, or Xe.

27. The structure of claim 21, further comprising a buffer layer deposited between the substrate and the dielectric layer.

28. The structure of claim 21, wherein the substrate includes a termination layer of atoms, and the dielectric layer is deposited on the termination layer.

29. The structure of claim 28, wherein the substrate is a silicon wafer.

30. The structure of claim 21, wherein the dielectric layer lies on the substrate without an interleaving silicon dioxide layer.

31. The structure of claim 30, wherein the substrate is a silicon wafer.

32. The structure of claim 21, wherein the dielectric layer is physically thick and provides high electrical permittivity.

* * * * *